United States Patent [19]

Rodgers, III

[11] 4,277,729
[45] Jul. 7, 1981

[54] SIMPLIFIED VERTICAL DEFLECTION CIRCUIT

[75] Inventor: Robert L. Rodgers, III, Lancaster, Pa.

[73] Assignee: RCA Corporation, New York, N.Y.

[21] Appl. No.: 94,287

[22] Filed: Nov. 19, 1979

[51] Int. Cl.³ ............................................. H01J 29/54
[52] U.S. Cl. .................................... 315/398; 315/403; 315/389
[58] Field of Search ................ 315/403, 387, 389, 398

[56] References Cited

U.S. PATENT DOCUMENTS

| 3,646,393 | 2/1972 | Tarr . | |
| 3,890,542 | 6/1975 | Zimmermann | 315/389 |
| 3,988,638 | 10/1976 | Nillesen | 315/388 |
| 4,188,567 | 2/1980 | Monroe | 315/389 |

Primary Examiner—Theodore M. Blum

Attorney, Agent, or Firm—Eugene M. Whitacre; Paul J. Rasmussen; William H. Meise

[57] ABSTRACT

A simplified bootstrap deflection circuit includes a sawtooth capacitor with one end grounded. First and second serially connected resistors provide charging current to form a ramp voltage across the capacitor. The noninverting input of an amplifier is coupled to receive the ramp. The amplifier output is coupled to a deflection winding and current sensing resistor. A feedback path couples the current sensing resistor to the inverting input terminal. A resistor is coupled to the inverting input terminal and to a reference potential. A bootstrap capacitor couples sawtooth feedback voltage at the inverting input terminal to the junction of the first and second capacitors for producing a constant voltage across the second resistor for linearizing the ramp. The feedback path includes a series variable resistor which acts as a centering control.

3 Claims, 3 Drawing Figures

SIMPLIFIED VERTICAL DEFLECTION CIRCUIT

BACKGROUND OF THE INVENTION

This invention relates to a simple vertical deflection circuit for a television apparatus.

In the field of surveillance and industrial cameras, it is desirable to keep the various circuits small in size, light in weight and relatively uncomplicated, with a low parts count, yet providing high quality operation. The vertical deflection drive for a small vidicon in a surveillance camera needs to supply only a relatively small amount of power. Thus, complex high-power drive circuits such as are commonly used in color television receivers are inappropriate. Nevertheless, size and centering controls are necessary.

A linear sawtooth generator and vertical deflection drive circuit are described in U.S. Pat. No. 3,646,393 issued Feb. 29, 1972 to Tarr. The Tarr arrangement provides independent size and centering controls, but has the disadvantages of requiring two separate amplifiers, one for deflection drive and the other for Miller integration, and has the further disadvantage of a sawtooth capacitor which is not coupled at either end to a fixed reference voltage. Such a floating sawtooth capacitor cannot be discharged by a switch driven relative to ground. Thus, the Tarr arrangement requires additional complexity in the circuits by which the sawtooth capacitor is driven. The Tarr arrangement includes a centering control which dissipates power continuously.

Simple sawtooth generators in which the capacitor is grounded are known, and the use of such sawtooth generators in conjunction with the vertical deflection circuit are also known, as described in U.S. Pat. No. 3,988,638 issued Oct. 26, 1976 to Nillesen. Such simple sawtooth generators, however, have the disadvantages of generating a nonlinear sawtooth voltage unless the source resistance is very high. An active current source could be used to linearize the charging current in an arrangement such as Nillesen's, but this introduces additional complexity.

It is desirable to have a vertical deflection circuit using resistor charging of a grounded sawtooth capacitor and which is provided with substantially noninteracting vertical size and centering controls.

SUMMARY OF THE INVENTION

A sawtooth generating circuit for driving a deflection winding includes a first capacitor having a first electrode coupled to a first point of reference potential, and also having a second electrode. First and second resistors are serially coupled between a second point of reference potential and the second electrode of the capacitor for providing current for charging the first capacitor to form a voltage ramp. A voltage amplifier has inverting and noninverting input terminals. The noninverting input terminal is coupled to the second electrode and an output terminal is coupled to the deflection winding for applying an output signal to the deflection winding. A current sensing resistor is serially coupled with the deflection winding for producing a feedback voltage signal representing the deflection current. The current sensing resistor is coupled with the inverting input terminal for closing a feedback loop for causing the deflection current to track the voltage ramp. A second capacitor is coupled to the inverting input and to the juncture of the first and second resistors for coupling the feedback voltage signal to the juncture for maintaining a relative constant voltage across the second resistor for maintaining a relatively constant current therethrough for linearizing the voltage ramp. A third resistor is coupled between a point of reference potential and the inverting input terminal of the amplifier. The feedback coupling comprises a variable resistor for forming with the third resistor a voltage divider which controls the magnitude of the deflection current during those intervals in which the first capacitor is discharged. Control of the resistance of the third resistor acts as a centering control.

DESCRIPTION OF THE INVENTION

Figure 1:
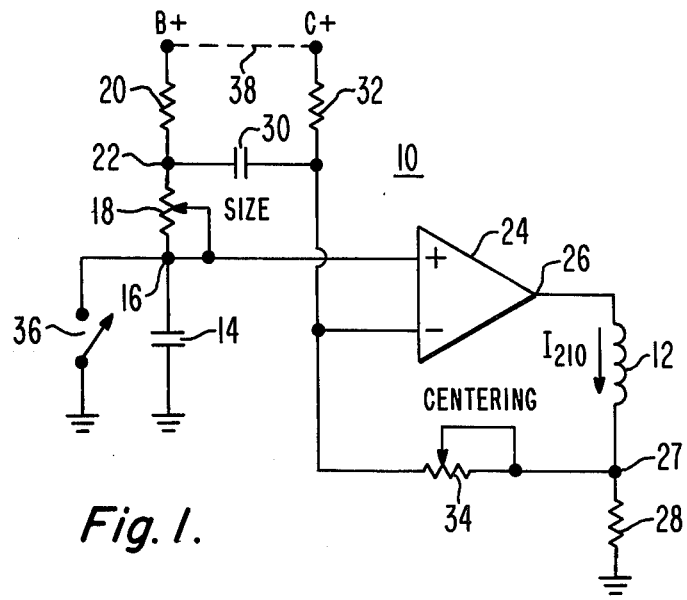
FIG. 1 is a schematic diagram of a deflection circuit according to the invention.

In FIG. 1, a deflection circuit designated generally as 10 produces a recurrent ramp current through a deflection winding 12 associated with an imaging tube, not shown. A ramp or sawtooth capacitor 14 has one end grounded. The other end of capacitor 14 is coupled to a juncture 16. Charging current for capacitor 14 is supplied from a variable resistor 18 connected to juncture 16. A resistor 20 is connected to resistor 18 at a juncture 22 and is also connected to a source B+ of operating potential for supplying the charge necessary for capacitor 14. The connection of resistors 18 and 20 in series with capacitor 14 between B+ and ground allows the flow of current for producing a ramp of voltage across capacitor 14.

The noninverting (+) input of an amplifier 24 is connected to juncture 16 for receiving voltage ramps therefrom. The voltage at output terminal 26 of amplifier 24 responds to the voltage at the noninverting input. Consequently, a voltage ramp is formed at output terminal 26 relative to ground. The voltage ramp is applied across the series combination of deflection winding 12 and a current sensing resistor 28, and a ramp of current flows through the series combination in response to the voltage ramp at output terminal 26.

A capacitor 30 has one end coupled to juncture 22 and the other end coupled to the inverting (−) input of amplifier 24. A resistor 32 is coupled between the inverting input of amplifier 26 and a source C+ of operating potential. A feedback path around amplifier 26 is closed by means of a variable resistor 34 coupled from current sensing resistor 28 to the inverting input of the amplifier. This degenerative feedback path forces the current through deflection winding 12 to track the ramp voltage at the noninverting input of amplifier 24 in a corresponding relationship. As known, a switch 36 is coupled across sawtooth capacitor 14 for periodically discharging capacitor 14 in synchronism with vertical synchronizing pulses under the control of synchronizing circuits, not shown.

Basically, the circuit arrangement of FIG. 1 is a bootstrap circuit, which is described for example in "Pulse, Digital and Switching Waveforms" by Millman and Taub, McGraw-Hill, 1965, at page 535 and at page 555 et seq. In normal operation, switch 36 is recurrently closed at times such as T3, T7 for intervals T3–T5, T7-T9 to discharge capacitor 14 and to discharge the capacitor voltage to zero and hold the voltage at juncture 16 at ground, as illustrated by waveform 200 in FIG. 2a. In an interval such as T4-T5 in which the voltage across capacitor 14 is zero, current flow through centering resistor 34 tends to make the inverting input of amplifier 24 positive with respect to ground. A first path for the flow of current through resistor 34 includes resistors 28 and 32 and source C+. A second path for the flow of current through resistor 34 is from B+ through resistors 20 and 28 and includes capacitor 30. This current is of such a polarity as to tend to make the inverting input of amplifier 24 positive, and the output voltage at terminal 26 in response slews negative. The slewing continues until the current through deflection winding 12 and current-sensing resistor 28 is of such a magnitude as to produce a voltage across resistor 28 which is negative with respect to ground by an amount sufficient to offset the voltage across centering resistor 34. Viewed in another manner, the voltage at juncture 27 slews until the voltage divider formed by resistors 32 and 34 produces a substantially zero voltage at the inverting input of amplifier 24.

Figure 2:
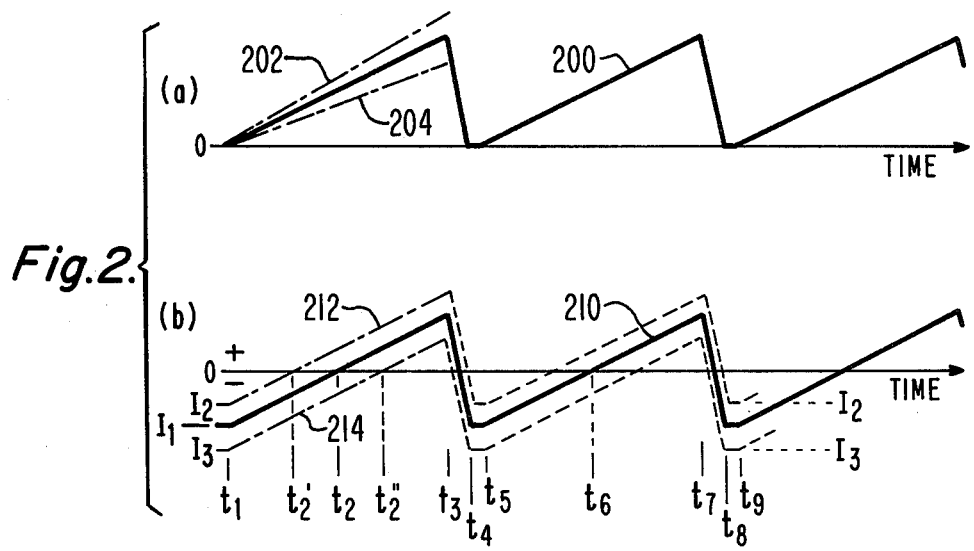
FIG. 2 illustrates as amplitude-time diagrams voltages and currents occurring in the arrangement of FIG. 1 during operation for various adjustments.

Thus, adjustment of the resistance of centering resistor 34 changes the voltage division ratio and therefore changes the voltage to which juncture 27 must be slewed to satisfy the feedback loop. Since the voltage at juncture 27 can be varied only by varying the current through deflection winding 12, variation in the resistance of centering resistor 34 changes the deflection current at the beginning of scan. Possible values which deflection current 210 of FIG. 2b may take in the interval T4-T5 are illustrated in FIG. 2b as I2 and I3.

At times T1, T5, T9 and the like switch 36 opens and remains open until the next following time at which the switch is closed. During those intervals such as T1-T5, T5-T7 in which switch 36 is open, current flowing through resistor 18 can charge capacitor 14 to form a ramp voltage such as 200. As ramp voltage 200 rises, the feedback loop around amplifier 24 causes the voltage at juncture 27 to track in a corresponding positive-going relation. Consequently, the voltage at juncture 27 goes more positive from its negative value at the beginning of scan, thereby reducing the voltage across resistor 28 as the deflection current decreases towards zero, as illustrated by waveform 210 in the intervals T1-T2, T5-T6. At some value of ramp voltage 200, the corresponding deflection current 210 will be reduced to zero, as at time T2 in FIG. 2b. The time T2 at which deflection current 210 reaches zero will depend upon the initial current through deflection winding 12 as set by centering control 34. For example, if a value of I2 is selected at time T1, the deflection current will reach zero at a time T2' earlier than time T2 as illustrated by waveform 212 of FIG. 2b. On the other hand, if the initial deflection current is larger than current I1, as for example I3, the deflection current will reach zero later during the half of scan, as illustrated by the intersection of waveform 214 with the zero axis at time T2" in FIG. 2b.

Ramp voltage 200 continues to increase after time T2, and the voltage at juncture 27 continues to rise (become more positive) in a tracking relation. Thus, the voltage at juncture 27 ramps positive from zero voltage, corresponding to an increase in the positive direction of deflection current I12, illustrated in FIG. 1 adjacent deflection winding 12. Increasing deflection current associated with ramping of sawtooth voltage 200 continues until a time such as T3 or T7 at which switch 36 closes.

When switch 36 closes, capacitor 14 is shorted through some finite resistance and its voltage drops rapidly to zero. At the same time, charging current flowing through resistor 18 is bypassed around capacitor 14 by closed switch 36. The ramp cycle begins again with the next following opening of switch 36.

During the positive-going ramping of voltage 200 during the scanning interval, a portion of the positive-going ramp voltage appearing at juncture 27 is coupled by way of the voltage divider including resistors 32 and 34 to the inverting input of amplifier 24, as mentioned. This positive-going ramp voltage has approximately the same magnitude as the ramp voltage across capacitor 14. This ramp is coupled by capacitor 30 to juncture 22. Consequently, during the scan interval, juncture 22 receives a positive-going ramp voltage approximately corresponding in magnitude to the ramp voltage at juncture 16. As a result, a substantially constant voltage appears across capacitor 18 during the scanning interval, and therefore a constant current flows therethrough for linearizing ramp voltage 200 in known bootstrap manner. Since a substantially constant voltage appears across resistor 18, changing the magnitude of resistor 18 changes the magnitude of the current by which sawtooth capacitor 14 is charged, and therefore changes the ramp rate, as illustrated by ramps 202 and 204 of FIG. 2a. A change in the ramp rate or slope of the ramp voltage applied to the noninverting terminal of amplifier 24 changes the slope of the deflection current 210. Thus, changing the magnitude or resistance of resistor 18 changes the total or absolute value of the current excursion through deflection winding 12, and therefore may be used as a size control. Adjustment of the resistance of centering resistor 34, on the other hand, changes the starting deflection current at the beginning of scan, as described and as illustrated in FIG. 2b.

Figure 3:
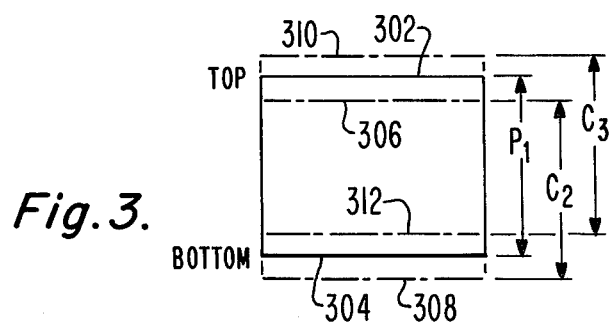
FIG. 3 illustrates the effect of the adjustments on the raster of a kinescope.

FIG. 3 illustrates the raster movements which would accompany adjustment of the size and centering controls of the arrangements of FIG. 1 if deflection winding 12 were the vertical deflection winding of a kinescope. Top and bottom lines 302 and 304 correspond to central positions of adjusting resitors 18 and 34 which give deflection currents such as 210. The central position subtended by the raster is shown by arrows P1. Decreasing the resistance of centering resistor 34 to give a decreased starting-position current such as I2 drops the top of the raster to a new position 306. However, because the current excursion is maintained constant this second position of the centering control merely moves the entire raster downward, so as to fall between 306 and 308 (portion 2). Increasing the value of centering resistor 34, on the other hand, increases the starting-position current without affecting the current excursion, whereby the raster takes on a position C3 lying between lines 310 and 312.

Adjustment of size resistor 18 does not affect the top of the raster at all, since the starting-point current (I1, I2, I3) is set by centering resistor 34. However, size resistor 18 does control the excursion, and so may be used to determine the bottom point of the raster. Thus, the top of the raster may be set to a particular point, such as the top of the viewing screen of a kinescope by adjusting centering resistor 34, and the size control may then be used substantially independently to set the position of the bottom of the raster near the bottom of the viewing screen of the kinescope.

In a particular embodiment of the invention, the following component values were found to provide satisfactory operation:

| B+, C+ | 8.5 volts |
|---|---|
| RESISTORS | |
| 18 | 500k ohms |
| 20 | 680k |
| 28 | 33 |
| 32 | 12k |
| 34 | 1000 |
| CAPACITORS | |
| 14 | 0.22μF |
| 30 | 0.1 |

Other embodiments of the invention will be obvious to those skilled in the art. In particular, source C+ may be made equal to source B+ as indicated by dotted connection 38. Also, by reversal of the deflection winding connections, the centering control may be used to set the bottom of the raster rather than the top.

I claim:

1. An improved sawtooth generating circuit for driving a deflection winding, comprising:

a first capacitor having a first electrode coupled to a first point of reference potential and having a second electrode;

first and second resistance means serially coupled between a second point of reference potential and said second electrode for providing current for charging said first capacitor to form a voltage ramp;

a voltage amplifier including an inverting input terminal and also including a noninverting input terminal coupled to said second electrode for generating and applying an output signal to the deflection winding;

current sensing resistance means serially coupled with said winding for producing a feedback voltage signal representing the current through said deflection winding in response to said output signal;

coupling means coupling said current sensing resistance means with said inverting input terminal for closing a feedback loop about said amplifier for causing said current produced in response to said output signal to track said voltage ramp;

second capacitance means coupled to said inverting input terminal and to the juncture of said first and second resistance means for coupling said feedback voltage signal to said juncture for maintaining a relatively constant voltage across said second resistance means for maintaining a relatively constant current therethrough for linearizing said voltage ramp;

third resistance means coupled between a point of reference potential and said inverting input terminal;

wherein the improvement lies in that said coupling means comprises variable resistance means for forming with said third resistance means a voltage divider for controlling the magnitude of said deflection current during those intervals in which said first capacitor is discharged for providing centering control of the raster.

2. An arrangement according to claim 1 comprising switch means coupled across said first capacitor for periodically discharging said first capacitor thereby producing recurrent flow of deflection current through said deflection winding.

3. An arrangement according to claim 1 or 2 wherein said point of reference potential to which said third resistance means is coupled to said second point of reference potential.

* * * * *